(12) United States Patent
Sugiyama et al.

(10) Patent No.: US 11,495,733 B2
(45) Date of Patent: Nov. 8, 2022

(54) MAGNETOSTRICTIVE TYPE SENSOR TEMPERATURE DETECTING CIRCUIT, MAGNETOSTRICTIVE TYPE SENSOR, AND TEMPERATURE DETECTING METHOD FOR MAGNETOSTRICTIVE TYPE SENSOR

(71) Applicant: Hitachi Metals, Ltd., Tokyo (JP)

(72) Inventors: Yuta Sugiyama, Tokyo (JP); Teruyuki Nakamura, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 180 days.

(21) Appl. No.: 17/012,605

(22) Filed: Sep. 4, 2020

(65) Prior Publication Data
US 2021/0074905 A1 Mar. 11, 2021

(30) Foreign Application Priority Data
Sep. 10, 2019 (JP) .............................. JP2019-164538

(51) Int. Cl.
*H01L 41/12* (2006.01)
*G01R 33/18* (2006.01)
(Continued)

(52) U.S. Cl.
CPC .............. *H01L 41/125* (2013.01); *G01K 7/38* (2013.01); *G01L 1/125* (2013.01); *G01R 33/18* (2013.01); *G01L 3/102* (2013.01)

(58) Field of Classification Search
CPC ......... H01L 37/04; H01L 41/06; H01L 41/12; H01L 41/125; H01L 41/20; H01L 41/47;
(Continued)

(56) References Cited

U.S. PATENT DOCUMENTS 4,989,460 A * 2/1991 Mizuno .................... G01L 3/102
73/862.335
6,397,661 B1 * 6/2002 Grimes .............. G01N 29/2412
73/61.79

(Continued)

FOREIGN PATENT DOCUMENTS

CN 108139278 A * 6/2018 ............... G01K 7/36
JP 2566687 B2 * 12/1996
(Continued)

*Primary Examiner* — Herbert K Roberts
(74) *Attorney, Agent, or Firm* — McGinn IP Law Group, PLLC

(57) ABSTRACT

A magnetostrictive-type sensor temperature-detecting circuit configured to be used in a magnetostrictive-type sensor including an applied stress-detecting coil, and a driving section to output an alternating voltage, excite the coil with a resulting alternating electric current, and switch flow directions of the electric current flowing in the coil in response to switching voltage polarities of the output alternating voltage, to detect a temperature of the coil in the sensor. This temperature-detecting circuit includes an alternating electric current direction switching time-detecting section to detect an amount of time from when the voltage polarities of the output alternating voltage are switched until when the flow directions of the electric current flowing in the coil are switched, and a temperature-computing section to compute the temperature of the coil on the basis of the amount of time detected by the alternating electric current direction switching time-detecting section.

7 Claims, 9 Drawing Sheets

(51) Int. Cl.
*G01K 7/38* (2006.01)
*G01L 1/12* (2006.01)
*G01L 3/10* (2006.01)

(58) Field of Classification Search
CPC ........ G01R 33/14; G01R 33/16; G01R 33/18; G01L 1/12; G01L 1/122; G01L 1/125; G01L 1/127; G01L 3/101; G01L 3/102; G01L 3/103; G01L 3/104; G01L 3/105; G01L 3/109; G01L 3/1435; G01L 23/14; G01L 23/145
See application file for complete search history.

(56) References Cited

U.S. PATENT DOCUMENTS

| | | | | |
|---|---|---|---|---|
| 10,393,809 | B2 * | 8/2019 | Bock | H01H 50/38 |
| 2007/0263699 | A1 * | 11/2007 | Clothier | H05B 6/062 |
| | | | | 374/E7.039 |
| 2016/0252415 | A1 * | 9/2016 | Lu | G01L 3/102 |
| | | | | 73/862.333 |
| 2017/0328788 | A1 * | 11/2017 | Coughlan | F02C 6/12 |
| 2018/0313700 | A1 * | 11/2018 | Pooley | G01K 7/38 |
| 2020/0161892 | A1 * | 5/2020 | Zhang | H02J 50/10 |

FOREIGN PATENT DOCUMENTS

| | | | | | |
|---|---|---|---|---|---|
| JP | 10153502 | A | * | 6/1998 | |
| JP | 2776693 | B2 | * | 7/1998 | |
| JP | 2000258517 | A | * | 9/2000 | |
| JP | 2001050829 | A | * | 2/2001 | |
| JP | 2001356059 | A | * | 12/2001 | |
| JP | 2003106913 | A | * | 4/2003 | |
| JP | 2003207400 | A | * | 7/2003 | |
| JP | 2004020199 | A | * | 1/2004 | |
| JP | 2004028732 | A | * | 1/2004 | |
| JP | 2004191069 | A | * | 7/2004 | |
| JP | 2007114088 | A | * | 5/2007 | |
| JP | 2009008547 | A | * | 1/2009 | |
| JP | 2014215082 | A | * | 11/2014 | |
| JP | 2017-049124 | A | | 3/2017 | |
| JP | 2018048956 | A | * | 3/2018 | |
| WO | WO-2011106825 | A2 | * | 9/2011 | ............. G01K 1/024 |
| WO | WO-2017195247 | A1 | * | 11/2017 | ............. B60L 3/003 |

* cited by examiner

3 TEMPERATURE COMPUTING SECTION

3 TEMPERATURE COMPUTING SECTION

MAGNETOSTRICTIVE TYPE SENSOR TEMPERATURE DETECTING CIRCUIT, MAGNETOSTRICTIVE TYPE SENSOR, AND TEMPERATURE DETECTING METHOD FOR MAGNETOSTRICTIVE TYPE SENSOR

CROSS-REFERENCE TO RELATED APPLICATION

The present application is based on Japanese patent application No. 2019-164538 filed on Sep. 10, 2019, the entire contents of which are incorporated herein by reference.

BACKGROUND OF THE INVENTION

1. Field of the Invention

The present invention relates to a magnetostrictive type sensor temperature detecting circuit, a magnetostrictive type sensor, and a temperature detecting method for the same magnetostrictive type sensor.

2. Description of the Related Art

Conventionally, a magnetostrictive type sensor has been known that is configured to use a magnetostrictive member having a magnetostrictive property that changes the magnetic permeability thereof when acted on by an applied stress such as an applied rotary torque or an applied load or the like, and detect a change in the magnetic permeability of the magnetostrictive member being acted on by the applied stress as a change in the inductance of a detecting coil, to thereby detect the applied stress acting on the magnetostrictive member. See, e.g., JP-A-2017-49124.

It has been known that the magnetostrictive type sensor is changed in the impedance of its detecting coil by changing in the temperature of the detecting coil, which leads to concern that the magnetostrictive type sensor may be lowered in detection accuracy. For the reason, for the magnetostrictive type sensor, detecting the temperature of its detecting coil and making a temperature correction on the detected applied stress is desired. As conceivable methods to detect the temperature of the detecting coil in the magnetostrictive type sensor, there are, for example, a method the provides a sensor (a thermocouple, or the like) configured to detect the temperature of the detecting coil in the magnetostrictive type sensor, or a method the uses a direct electric current signal, measures the resistance value of the detecting coil in the magnetostrictive type sensor, and computes the temperature of the detecting coil on the basis of the measured resistance value of the detecting coil.

[Patent Document 1] JP-A-2017-49124

SUMMARY OF THE INVENTION

However, the method the provides a sensor (a thermocouple, or the like) configured to detect the temperature of the detecting coil in the magnetostrictive type sensor becomes high in cost, and leads to concern that the sensor section of the same magnetostrictive type sensor may be made large in size. Also, the method the uses a direct electric current signal and measures the resistance value of the detecting coil in the magnetostrictive type sensor requires a direct electric current circuit configured to detect the temperature of the detecting coil in the same magnetostrictive type sensor separately from the applied stress detecting circuit for the same magnetostrictive type sensor and, as a result, leads to complexity of the circuit configuration of the same magnetostrictive type sensor, and difficulty of the measurement of the temperature of the detecting coil in the same magnetostrictive type sensor when detecting the applied stress acting on the magnetostrictive member for the same magnetostrictive type sensor as well.

In light of the foregoing, it is an object of the present invention to provide a magnetostrictive type sensor temperature detecting circuit, a magnetostrictive type sensor, and a temperature detecting method for the same magnetostrictive type sensor, that are configured to be able to detect the temperature of a detecting coil in the same magnetostrictive type sensor at a low cost and with a simple configuration, and that are configured to be able to measure the temperature of the detecting coil even when detecting an applied stress acting on a magnetostrictive member for the same magnetostrictive type sensor.

For the purpose of solving the above-described problems, the present invention provides a magnetostrictive type sensor temperature detecting circuit, which is configured to be used in a magnetostrictive type sensor including a detecting coil provided around a periphery of a magnetostrictive member and a driving section configured to excite the detecting coil with an alternating electric current, to detect an applied stress acting on the magnetostrictive member on the basis of a change in an inductance of the detecting coil, to detect a temperature of the detecting coil, wherein the driving section is configured to output an alternating voltage configured as a square wave voltage, and switch flow directions of the electric current flowing in the detecting coil in response to switching voltage polarities of the output alternating voltage, wherein the temperature detecting circuit comprises an electric current switching time detecting section configured to detect an amount of time from when the voltage polarities of the output alternating voltage are switched until when the flow directions of the electric current flowing in the detecting coil are switched, and a temperature computing section configured to compute the temperature of the detecting coil on the basis of the amount of time detected by the electric current switching time detecting section.

Further, for the purpose of solving the above-described problems, the present invention provides a magnetostrictive type sensor, comprising: comprising: a detecting coil provided around a periphery of a magnetostrictive member; a driving section configured to excite the detecting coil with an alternating electric current, to detect an applied stress acting on the magnetostrictive member on the basis of a change in an inductance of the detecting coil; and a temperature correction section configured to make a temperature correction on the detected applied stress on the basis of the temperature of the detecting coil having been detected by the magnetostrictive type sensor temperature detecting circuit.

Further, for the purpose of solving the above-described problems, the present invention provides a magnetostrictive type sensor temperature detecting method, which is configured to be used in a magnetostrictive type sensor including a detecting coil provided around a periphery of a magnetostrictive member and a driving section configured to excite the detecting coil with an alternating electric current, to detect an applied stress acting on the magnetostrictive member on the basis of a change in an inductance of the detecting coil, to detect a temperature of the detecting coil, wherein the driving section is configured to output an alternating voltage configured as a square wave voltage, and switch flow directions of the electric current flowing in the detecting coil in response to switching voltage polarities of the output alternating voltage, to detect a temperature of the detecting coil, the temperature detecting method comprising: detecting an amount of time from when the voltage polarities of the output alternating voltage are switched until when the flow directions of the electric current flowing in the detecting coil are switched; and computing the temperature of the detecting coil on the basis of the detected amount of time.

Points of the Invention

According to the present invention, it is possible to provide the magnetostrictive type sensor temperature detecting circuit, the magnetostrictive type sensor, and the temperature detecting method for the same magnetostrictive type sensor, that are configured to be able to detect the temperature of the detecting coil in the same magnetostrictive type sensor at a low cost and with a simple configuration, and that are configured to be able to measure the temperature of the detecting coil even when detecting the applied stress acting on the magnetostrictive member for the same magnetostrictive type sensor.

DETAILED DESCRIPTION OF THE PREFERRED EMBODIMENTS

Embodiment

An embodiment of the present invention will be described below in conjunction with the accompanying drawings.

Figure 1:
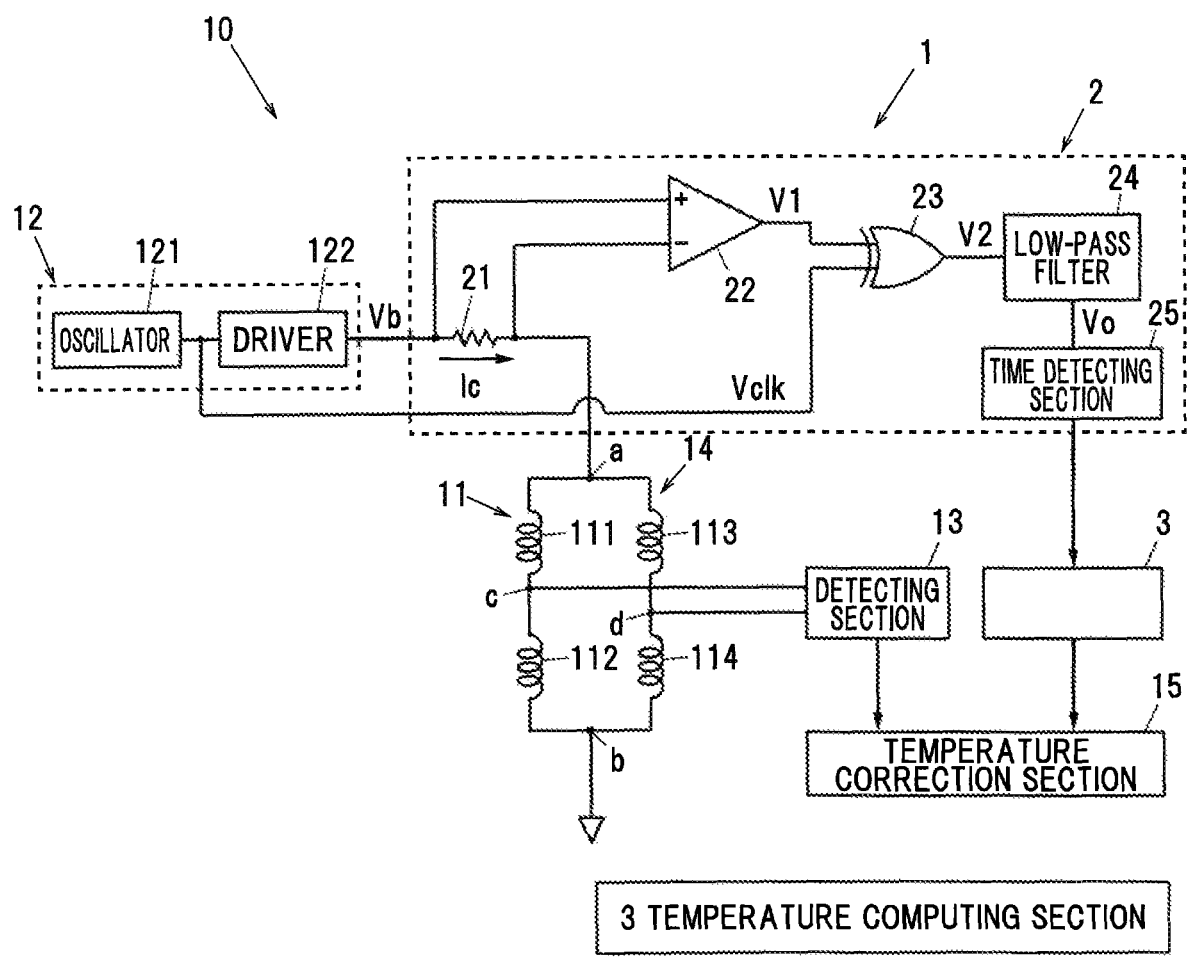
FIG. 1 is a block diagram showing an applied stress detecting circuit for constituting a magnetostrictive type sensor and configured in such a manner as to include a magnetostrictive type sensor temperature detecting circuit according to one embodiment of the present invention.

FIG. 1 is a block diagram showing an applied stress detecting circuit 10 for constituting a magnetostrictive type sensor and configured in such a manner as to include a magnetostrictive type sensor temperature detecting circuit 1 according to the present embodiment. As shown in FIG. 1, this applied stress detecting circuit 10 for constituting the magnetostrictive type sensor according to the present invention includes a detecting coil 11, which is configured to be provided around a periphery of a magnetostrictive member not shown, a driving section 12, which is configured to excite the detecting coil 11 with an alternating electric current, an applied stress detecting section 13, which is configured to detect an applied stress acting on the magnetostrictive member on the basis of a change in an inductance of the detecting coil 11, and a magnetostrictive type sensor temperature detecting circuit 1 according to the present embodiment.

In the present embodiment, the applied stress detecting circuit 10 for constituting the magnetostrictive type sensor according to the present invention includes a bridge circuit 14, which is configured to be composed of four of the detecting coils 11 being bridge connected therein. Herein, those four detecting coils 11 will each also be referred to as the first, the second, the third and the fourth detecting coil 111, 112, 113 and 114. The bridge circuit 14 is configured in such a manner as to connect the first detecting coil 111 and the second detecting coil 112 together in series, while connecting the third detecting coil 113 and the fourth detecting coil 114 together in series, and connect the series connected first and second detecting coils 111 and 112 and the series connected third and fourth detecting coils 113 and 114 together in parallel. The first, the second, the third and the fourth detecting coils 111 to 114 are configured in such a manner as to be the same in the number of turns and substantially the same in impedance.

The driving section 12 for the applied stress detecting circuit 10 constituting the magnetostrictive type sensor according to the present invention is configured to apply an alternating voltage Vb between a contact point a between the first detecting coil 111 and the third detecting coil 113 connected together in parallel and a contact point b between the second detecting coil 112 and the fourth detecting coil 114 connected together in parallel in the bridge circuit 14. In the present embodiment, the driving section 12 for the applied stress detecting circuit 10 constituting the magnetostrictive type sensor according to the present invention is configured in such a manner that the alternating voltage Vb to be output by the driving section 12 is a square wave voltage, to switch flow directions of a resulting alternating electric current Ic flowing in the first, the second, the third and the fourth detecting coils 111, 112, 113 and 114 in response to switching voltage polarities of the alternating voltage Vb.

The driving section 12 for the applied stress detecting circuit 10 constituting the magnetostrictive type sensor according to the present invention includes an oscillator 121, which is configured to produce a square wave signal Vclk as a periodic oscillating electronic signal, and a driver 122, which is configured to create the alternating voltage Vb from the square wave signal Vclk output from the oscillator 121 and output the alternating voltage Vb. The driver 122 constituting the driving section 12 is configured to create, as the alternating voltage Vb, a square wave voltage the alternately repeats a positive voltage and a negative voltage being equal in absolute value with a predetermined period (see FIG. 3) and output the square wave voltage as the alternating voltage Vb. The frequency of the alternating voltage Vb to be created by the driver 122 is equal to the frequency of the square wave signal Vclk output from the oscillator 121.

The applied stress detecting section 13 for constituting the applied stress detecting circuit 10 constituting the magnetostrictive type sensor according to the present invention is configured to measure a voltage between a contact point c between the first detecting coil 111 and the second detecting coil 112 connected together in series and a contact point d between the third detecting coil 113 and the fourth detecting coil 114 connected together in series in the bridge circuit 14.

In the applied stress detecting circuit 10 constituting the magnetostrictive type sensor according to the present invention, when the driving section 12 applies the alternating voltage Vb between the contact point a between the first detecting coil 111 and the third detecting coil 113 connected together in parallel and the contact point b between the second detecting coil 112 and the fourth detecting coil 114 connected together in parallel in the bridge circuit 14, the alternating electric current resulting from the application of the alternating voltage Vb flows in the first, the second, the third and the fourth detecting coils 111, 112, 113 and 114, to AC (alternating current) excite the first, the second, the third and the fourth detecting coils 111, 112, 113 and 114, and thereby produce a magnetic flux through the first, the second, the third and the fourth detecting coils 111, 112, 113 and 114. The first, the second, the third and the fourth detecting coils 111, 112, 113 and 114 are arranged around the periphery of the magnetostrictive member to be subjected to an applied stress measurement, and the magnetic flux produced by the first, the second, the third and the fourth detecting coils 111, 112, 113 and 114 passes through the magnetostrictive member. Since the magnetostrictive member is changed in its magnetic permeability when acted on by an applied stress, the impedances of the first, the second, the third and the fourth detecting coils 111, 112, 113 and 114 are changed depending on the conditions of the applied stress acting on the magnetostrictive member, such as the magnitude and direction of an applied rotary torque acting on the magnetostrictive member in the examples of FIGS. 4A, 4B and 5, which will be described later, and therefore the voltage to be detected in the applied stress detecting section 13, in other words, the voltage between the contact point c between the first detecting coil 111 and the second detecting coil 112 connected together in series and the contact point d between the third detecting coil 113 and the fourth detecting coil 114 connected together in series in the bridge circuit 14 is changed depending thereon. The applied stress detecting section 13 is configured to detect the applied stress acting on the magnetostrictive member on the basis of the voltage detected in the applied stress detecting section 13. A specific example of the magnetostrictive type sensor according to the present invention and the arrangement of the detecting coils 111, 112, 113 and 114 constituting the bridge circuit 14 and the like will be described in detail later. Note the since the voltage to be detected in the applied stress detecting section 13, in other words, the voltage between the contact point c between the first detecting coil 111 and the second detecting coil 112 connected together in series and the contact point d between the third detecting coil 113 and the fourth detecting coil 114 connected together in series in the bridge circuit 14 is the alternating voltage, the applied stress detecting section 13 may be configured in such a manner as to detect the applied stress acting on the magnetostrictive member on the basis of a signal detected in the applied stress detecting section 13 by amplifying the voltage between the contact points c and d with a differential amplifying circuit in order to remove in-phase components and detect only differential components.

The detected value (the detected value of the applied stress acting on the magnetostrictive member) detected in the applied stress detecting section 13 is output to a temperature correction section 15. The temperature correction section 15 is configured to make a temperature correction on the detected value of the applied stress having been input from the applied stress detecting section 13 by using the temperature of the constituent detecting coils 111, 112, 113 and 114 of the bridge circuit 14 having been detected in the magnetostrictive type sensor temperature detecting circuit 1, which will be described later. The detected value of the applied stress having been temperature corrected in the temperature correction section 15 serves as the output to be produced by the applied stress detecting circuit 10 of the magnetostrictive type sensor according to the present invention. Note that the applied stress detecting section 13 and the temperature correction section 15 are incorporated in a microcomputer or a personal computer, and are configured as an appropriate combination of a CPU, a software, a memory, an interface and the like.

(Magnetostrictive Type Sensor Temperature Detecting Circuit 1)

The magnetostrictive type sensor temperature detecting circuit 1 is a circuit configured to detect the temperature of the detecting coil 11 (the four detecting coils 111, 112, 113 and 114). The magnetostrictive type sensor temperature detecting circuit 1 includes an electric current switching time detecting section 2 and a temperature computing section 3.

For the magnetostrictive type sensor temperature detecting circuit 1, the electric current switching time detecting section 2 thereof is configured to detect an amount of time from when the voltage polarity of the alternating voltage Vb output from the driver 122 of the driving section 12 is switched from positive to negative or from negative to positive until when the flow directions of the alternating electric current Ic flowing in the detecting coil 11 (the four detecting coils 111, 112, 113 and 114) are switched.

Figure 2A:
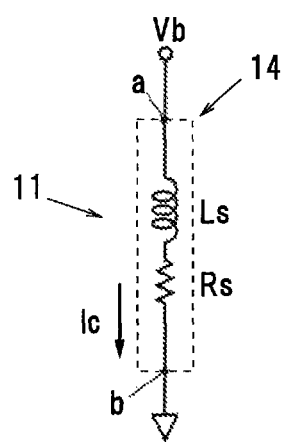
FIG. 2A is an explanatory diagram showing a principle of the magnetostrictive type sensor temperature detecting circuit according to one embodiment of the present invention.

As shown in FIG. 2A, the bridge circuit 14 composed of the first, the second, the third and the fourth detecting coils 111, 112, 113 and 114 can be represented by an equivalent circuit which is composed of an inductance component Ls and a resistance component Rs connected together in series. Herein, for simplicity of description thereof, a case in which the alternating voltage Vb is applied directly to the bridge circuit 14 is considered. Since the alternating voltage Vb is the square wave voltage the alternately outputs a positive voltage and a negative voltage being equal in absolute value with a predetermined period, as shown in FIG. 2B, the flow directions of the resulting alternating electric current Ic flowing in the four detecting coils 111, 112, 113 and 114 constituting the bridge circuit 14 are switched in response to the switching of the voltage polarities of the alternating voltage Vb.

Figure 2B:
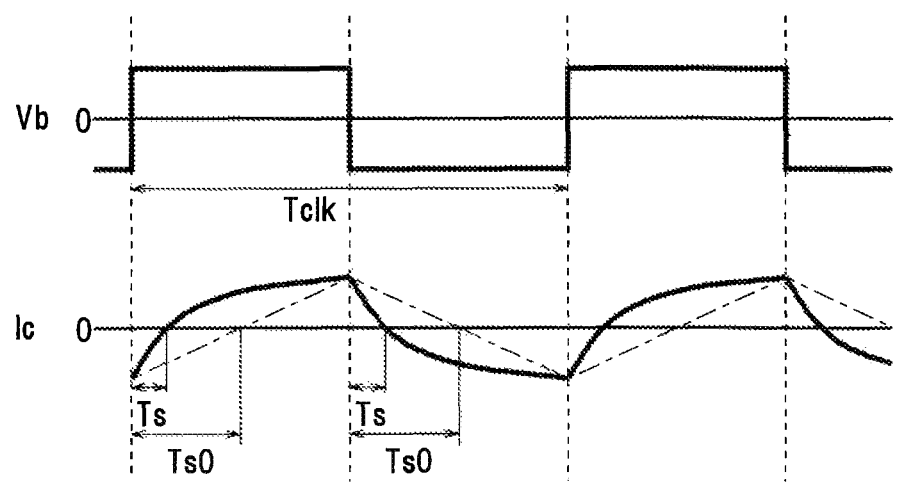
FIG. 2B is an explanatory diagram showing the same principle of the magnetostrictive type sensor temperature detecting circuit according to one embodiment of the present invention.

Herein, when the four detecting coils 111, 112, 113 and 114 constituting the bridge circuit 14 are ideal coils, the resistance component Rs is zero and, as a result, the alternating electric current Ic is linearly changed with the passage of time, as indicated by the alternate long and short dash line in FIG. 2B. In this case, when the period of the alternating voltage Vb (the is, the period of the square wave signal Vclk) is denoted by Tclk, the amount of time, Ts0, from when the voltage polarity of the alternating voltage Vb is switched from positive to negative or from negative to positive until when the flow directions of the alternating electric current Ic flowing in the four detecting coils 111, 112, 113 and 114 constituting the bridge circuit 14 are switched, is represented by the following formula (1).

$$Ts0 = Tclk/4 \qquad (1)$$

However, in practice, it is known the, in the four detecting coils 111, 112, 113 and 114 constituting the bridge circuit 14, there exists the resistance component Rs, and the this resistance component Rs is varied depending on the temperature of the four detecting coils 111, 112, 113 and 114 constituting the bridge circuit 14. For example, when the temperature of the four detecting coils 111, 112, 113 and 114 constituting the bridge circuit 14 is risen, the resistance component Rs is increased. As a result, due to the influence of the increased resistance component Rs, as shown by the solid line in FIG. 2B, the amount of time, Ts, from when the voltage polarity of the alternating voltage Vb is switched from positive to negative or from negative to positive until when the flow directions of the alternating electric current Ic are switched, becomes shorter than the amount of time, Ts0, taken when the four detecting coils 111, 112, 113 and 114 constituting the bridge circuit 14 are ideal coils. Specifically, the amount of time, Ts, from when the voltage polarity of the alternating voltage Vb is switched from positive to negative or from negative to positive until when the flow directions of the alternating electric current Ic are switched, can be expressed by the following formula (2).

$$Ts = \frac{Ls}{Rs}\log\left[\frac{2}{1+e^{-\frac{Rs}{Ls}Ts\theta}}\right] \qquad (2)$$

According to the above formula (2), the amount of time, Ts is changed depending on the resistance component Rs the is changed depending on the temperature of the four detecting coils 111, 112, 113 and 114 constituting the bridge circuit 14. Accordingly, the temperature of the four detecting coils 111, 112, 113 and 114 constituting the bridge circuit 14 can be calculated by measuring this amount of time, Ts, (more specifically, the duty ratio of the amount of time, Ts, to the period Tclk of the alternating voltage Vb). From the above formula (2), since the amount of time, Ts, is also changed depending on the inductance component Ls, for the four detecting coils 111, 112, 113 and 114 constituting the bridge circuit 14, it is desirable to use the coils whose change in the inductance component Ls due to temperature is as small as possible.

Note the if the frequency of the square wave signal Vclk is made high and exceeds the resonance frequency of the four detecting coils 111, 112, 113 and 114 constituting the bridge circuit 14, then the signal behavior in each part may be changed and the normal measurement may not be able to be made. For the reason, the frequency of the square wave signal Vclk is set to be sufficiently smaller than the resonance frequency of the four detecting coils 111, 112, 113 and 114 constituting the bridge circuit 14.

Turning back to FIG. 1, in the present embodiment, for the magnetostrictive type sensor temperature detecting circuit 1, the electric current switching time detecting section 2 thereof includes an electric current detecting resistor 21, which is connected in series with the four detecting coils 111, 112, 113 and 114 constituting the bridge circuit 14, so that the electric current switching time detecting section 2 is able to detect the flow directions of the alternating electric current Ic flowing in the electric current detecting resistor 21. Note the since the electric current detecting resistor 21 is connected in series with the four detecting coils 111, 112, 113 and 114 constituting the bridge circuit 14, the flow directions of the electric current flowing in the electric current detecting resistor 21 and the electric current flowing in the four detecting coils 111, 112, 113 and 114 constituting the bridge circuit 14 are the same.

More specifically, for the magnetostrictive type sensor temperature detecting circuit 1, the electric current switching time detecting section 2 thereof includes a comparator 22, with two input terminals of the comparator 22 being connected to both ends, respectively, of the electric current detecting resistor 21 in the electric current switching time detecting section 2, so that the electric current switching time detecting section 2 is able to detect the flow directions of the electric current flowing in the electric current detecting resistor 21 in the electric current switching time detecting section 2 on the basis of an output voltage signal V1 at the one output terminal of the comparator 22. In the present embodiment, in the electric current switching time detecting section 2 of the magnetostrictive type sensor temperature detecting circuit 1, a driving section 12 side end portion of the electric current detecting resistor 21 is connected to a non-inverting input terminal of the comparator 22, while a detecting coil 11 side (bridge circuit 14 side) end portion of the electric current detecting resistor 21 is connected to an inverting input terminal of the comparator 22. This allows the comparator 22 to be configured in such a manner as to output a high (1) voltage signal at the one output terminal thereof when the flow direction of the alternating electric current Ic flowing in the electric current detecting resistor 21 is the direction from the electric current detecting resistor 21 side to the detecting coil 11 side (the bridge circuit 14 side), or output a low (0) voltage signal at the one output terminal thereof when the flow direction of the alternating electric current Ic flowing in the electric current detecting resistor 21 is the direction from the detecting coil 11 side (the bridge circuit 14 side) to the electric current detecting resistor 21 side. Note the if the signals to be input to the comparator 22 are small, then an amplifier such as a differential amplifier or the like may be provided in the preceding stage. This makes it possible for the electric current switching time detecting section 2 to detect the flow directions of the alternating electric current Ic flowing in the electric current detecting resistor 21 in the electric current switching time detecting section 2, depending on whether the output voltage signal V1 at the one output terminal of the comparator 22 is high or low.

In addition, for the magnetostrictive type sensor temperature detecting circuit 1, the electric current switching time detecting section 2 thereof includes an exclusive OR circuit (hereinafter referred to as the XOR circuit) 23, which are configured to be fed with the output voltage signal V1 at the one output terminal of the comparator 22 and the square wave signal Vclk output from the oscillator 121 respectively, and one output terminal, which is configured to output an exclusive OR signal V2 configured as an exclusive OR of the output voltage signal V1 at the one output terminal of the comparator 22 and the square wave signal Vclk output from the oscillator 121, a low-pass filter 24, which is configured to be fed with the exclusive OR output voltage signal V2 at the one output terminal of the XOR circuit 23, and a time detecting section 25, which is configured to detect the amount of time, Ts, from when the voltage polarities of the output alternating voltage Vb are switched until when the flow directions of the alternating electric current Ic flowing in the four detecting coils 111, 112, 113 and 114 constituting the bridge circuit 14 (the alternating electric current Ic flowing in the electric current detecting resistor 21) are switched, on the basis of an output voltage Vo from the low-pass filter 24.

Figure 3:
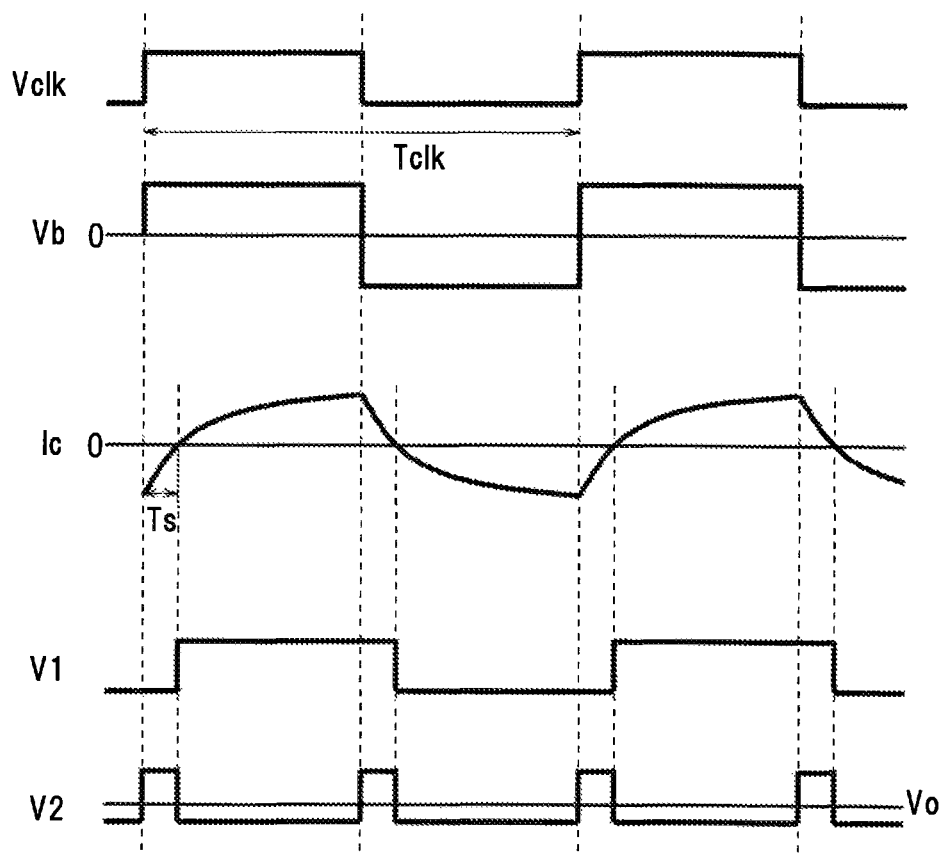
FIG. 3 is an explanatory time chart showing an operation of the magnetostrictive type sensor temperature detecting circuit shown in FIG. 1.

FIG. 3 shows time charts for the square wave signal Vclk output from the oscillator 121 of the driving section 12, the alternating voltage Vb output from the driver 122 of the driving section 12, the alternating electric current Ic flowing in the electric current detecting resistor 21 of the electric current switching time detecting section 2, the output voltage signal V1 at the one output terminal of the comparator 22 of the electric current switching time detecting section 2 and the output voltage signal V2 at the one output terminal of the XOR circuit 23 of the electric current switching time detecting section 2. As shown in FIG. 3, the driver 122 of the driving section 12 creates the square wave alternating voltage signal Vb reversing positive and negative in synchronization with the square wave signal Vclk output from the oscillator 121 of the same driving section 12, and the flow directions of the alternating electric current Ic flowing in the electric current detecting resistor 21 of the electric current switching time detecting section 2 are switched in response to the switching of the voltage polarities of the square wave alternating voltage signal Vb output from the driver 122 of the same driving section 12. At this point of time, the positive and negative of the alternating electric current Ic flowing in the electric current detecting resistor 21 of the electric current switching time detecting section 2 are switched after a time lag of the amount of time, Ts, from when the voltage polarities of the square wave alternating voltage signal Vb are switched. In response to this switching of the positive and negative of the alternating electric current Ic flowing in the electric current detecting resistor 21 of the electric current switching time detecting section 2, the output voltage signal V1 at the one output terminal of the comparator 22 of the same electric current switching time detecting section 2 is switched between the high (1) voltage signal and the low (0) voltage signal with the time lag of the amount of time, Ts, from when the voltage polarities of the square wave alternating voltage signal Vb are switched. Accordingly, the output voltage signal V2 at the one output terminal of the XOR circuit 23 of the same electric current switching time detecting section 2, which is the exclusive OR of the output voltage signal V1 and the square wave signal Vclk, becomes high only for the amount of time, Ts, (i.e., the period of time for which the positive and negative of the square wave alternating voltage signal Vb and the positive and negative of the alternating electric current Ic vary), but otherwise the output voltage signal V2 becomes low.

The low-pass filter 24 of the electric current switching time detecting section 2 of the magnetostrictive type sensor temperature detecting circuit 1 is the filter configured to take the average of the voltages of the output voltage signal V2 at the one output terminal of the XOR circuit 23 of the same electric current switching time detecting section 2, and the time constant in the low-pass filter 24 is set to become sufficiently longer than the period Tclk of the square wave signal Vclk output from the oscillator 121 of the driving section 12. The output voltage V0 (V) from the low-pass filter 24 is expressed by the following formula (3) when the high level of the output voltage signal V2 is VDD (V) and the low level of the output voltage signal V2 is 0 (V).

$$V0=(Ts/Tclk) \times VDD \qquad (3)$$

In the electric current switching time detecting section 2 of the magnetostrictive type sensor temperature detecting circuit 1, the time detecting section 25 is incorporated in a microcomputer or a personal computer, and is configured as an appropriate combination of a CPU, a software, a memory, an interface and the like. The time detecting section 25 is configured to detect the amount of time, Ts, on the basis of the output voltage Vo from the low pass filter 24, using the above formula (3).

The temperature computing section 3 of the magnetostrictive type sensor temperature detecting circuit 1 is configured as an appropriate combination of an analog to digital conversion device (hereinafter, referred to as the ADC) the is configured to convert the output voltage Vo from the low-pass filter 24 into a digital signal, a microcomputer, a software mounted in the microcomputer, and the like. In the magnetostrictive type sensor temperature detecting circuit 1, the temperature computing section 3 is configured to compute the temperature of the four detecting coils 111, 112, 113 and 114 constituting the bridge circuit 14, on the basis of the amount of time, Ts, detected by the time detecting section 25 of the electric current switching time detecting section 2. The temperature computing section 3 is configured to compute the temperature of the four detecting coils 111, 112, 113 and 114 constituting the bridge circuit 14, from the amount of time, Ts, on the basis of, for example, a preset relation between the amount of time, Ts, and the temperature of the four detecting coils 111, 112, 113 and 114 constituting the bridge circuit 14, or a database with a pre-computed relationship between the amount of time, Ts, and the temperature of the four detecting coils 111, 112, 113 and 114 constituting the bridge circuit 14, or the like. In the magnetostrictive type sensor temperature detecting circuit 1, the temperature of the constituent four detecting coils 111, 112, 113 and 114 of the bridge circuit 14 having been computed in the temperature computing section 3 is output to the temperature correction section 15 and used in the temperature correction with the temperature correction section 15.

(Magnetostrictive Type Sensor 100)

Figure 4A:
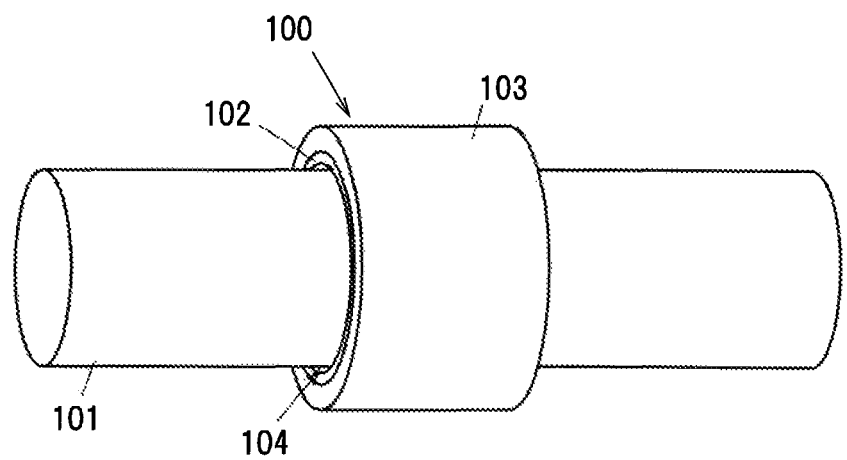
FIG. 4A is a perspective view showing one example of the magnetostrictive type sensor according to the present invention.
Figure 4B:
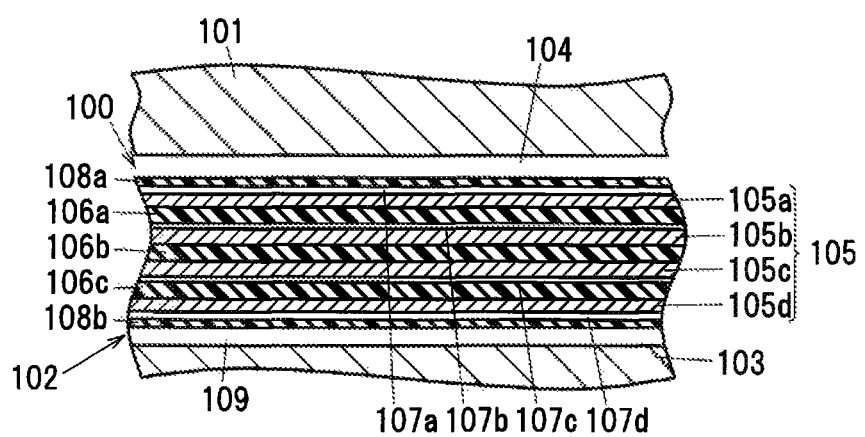
FIG. 4B is a cross-sectional view showing a laminated structure of a flexible substrate for constituting the magnetostrictive type sensor according to the present invention.
Figure 5:
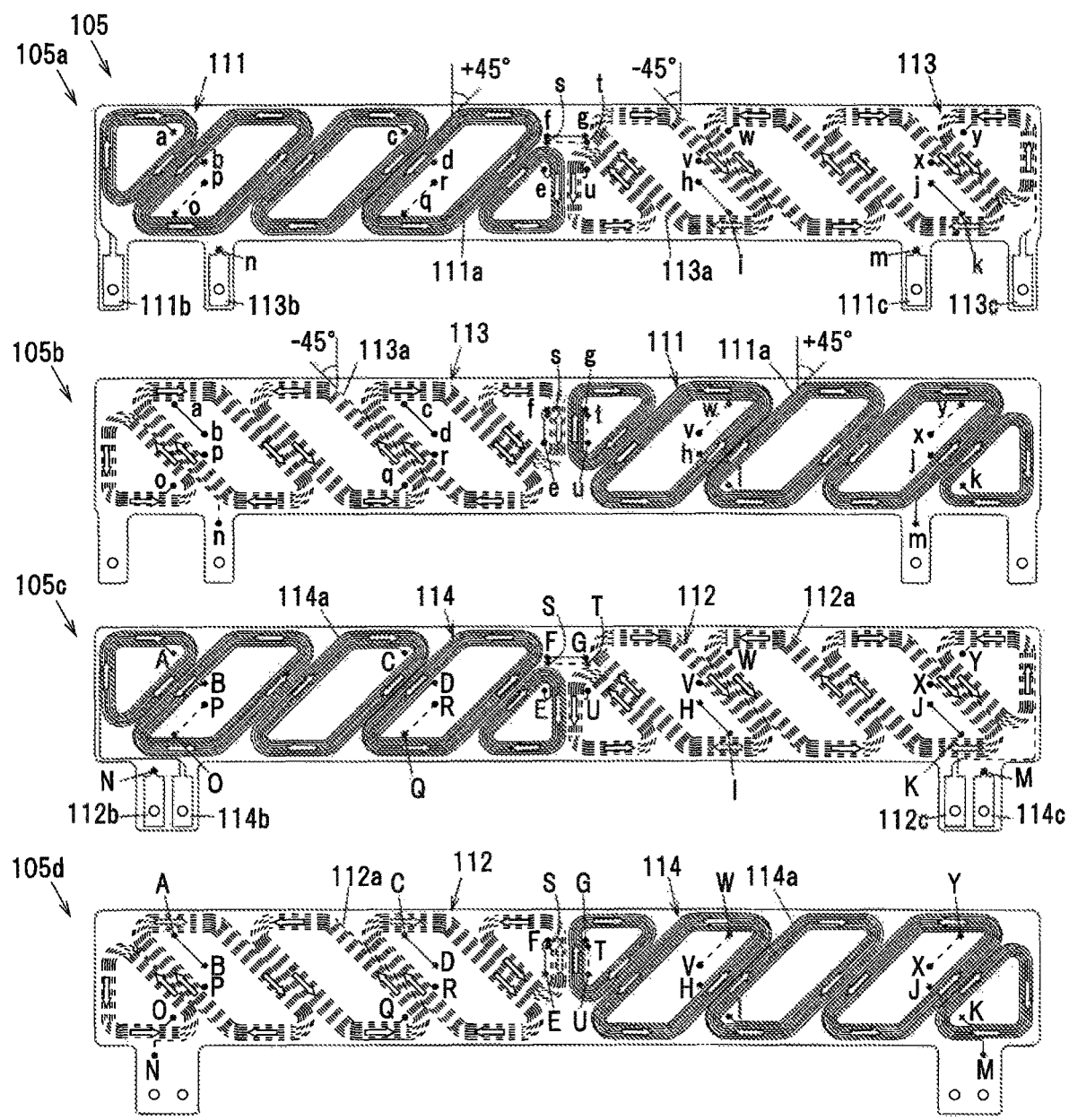
FIG. 5 is a diagram showing one example of a respective wiring pattern formed in each wiring layer of the flexible substrate shown in FIG. 4B.

Next, a specific example of the magnetostrictive type sensor 100 to which the applied stress detecting circuit 10 of FIG. 1 for the magnetostrictive type sensor 100 is applied will be described. FIG. 4A is a perspective view showing one example of the magnetostrictive type sensor 100, and FIG. 4B is a cross-sectional view showing a laminated structure of a flexible substrate 102 for constituting the magnetostrictive type sensor 100. FIG. 5 is a diagram showing one example of a respective wiring pattern formed in each wiring layer 105 of the flexible substrate 102 shown in FIG. 4B.

As shown in FIGS. 4A, 4B and 5, the magnetostrictive type sensor 100 is fitted around the periphery of a rotary shaft 101, which serves as the magnetostrictive member in the present invention, and is the sensor configured to measure an applied torque (an applied rotary torque) acting on the rotary shaft 101.

The rotary shaft 101 is configured to be made of a material having a magnetostrictive property, and is formed in a circular columnar shape (a rod shape). Examples of the material having the magnetostrictive property include a nickel, an iron-aluminum alloy, an iron-cobalt alloy and the like. Note the, as the material to be used in the rotary shaft 101, either of a positive magnetostrictive member whose magnetic permeability is decreased during compression and whose magnetic permeability is increased during tension, or a negative magnetostrictive member whose magnetic permeability is increased during compression and whose magnetic permeability is decreased during tension, may be used. The rotary shaft 101 is, for example, a shaft configured to be used in torque transmission in a power train system or a shaft configured to be used in torque transmission in an engine of a vehicle.

The magnetostrictive type sensor 100 includes a flexible substrate 102, which is coaxially arranged with a space 104 provided between it and the rotary shaft 101, and a magnetic body ring 103, which is coaxially arranged around a periphery of the flexible substrate 102.

The magnetic body ring 103 is made of a magnetic body (a ferromagnetic body), and is formed in a hollow circular cylindrical shape. The flexible substrate 102 is adhesively fixed to an inner peripheral surface of the magnetic body ring 103. The magnetic body ring 103 serves to suppress the occurrence of an external leakage of the magnetic flux produced by the four detecting coils 111, 112, 113 and 114 constituting the bridge circuit 14 and the occurrence of a lowering in the sensitivity of the magnetostrictive type sensor 100 resulting from the external leakage of the magnetic flux.

In the magnetostrictive type sensor 100, the space 104 is formed between the flexible substrate 102 and the rotary shaft 101, in such a manner that the magnetostrictive type sensor 100 is not brought into contact with the rotary shaft 101. The magnetostrictive type sensor 100 is fixed to a fixing member such as a housing or the like, in such a manner that the magnetostrictive type sensor 100 is prevented from being rotated with the rotation of the rotary shaft 101.

As shown in FIG. 4B, the flexible substrate 102 for the magnetostrictive type sensor 100 is configured in such a manner as to have at least two wiring layers 105 therein. Herein, a case will be described in which the flexible substrate 102 has therein four of the wiring layers 105 which are referred to as the first wiring layer 105a, the second wiring layer 105b, the third wiring layer 105c, and the fourth wiring layer 105d, but the number of the wiring layers 105 is not limited to the above number.

The first wiring layer 105a is formed on a frontside surface of a first base resin layer 106a made of a polyimide, while the backside surface of the first base resin layer 106a is adhesively fixed to the second wiring layer 105b with an adhesive layer 107b therebetween. A first coverlay layer 108a made of a polyimide is provided on the frontside surface of the first wiring layer 105a with an adhesive layer 107a therebetween, and is subjected to an electrical insulating treatment.

The second wiring layer 105b is formed on the frontside surface of the second base resin layer 106b made of a polyimide, and the third wiring layer 105c is formed on the backside surface of the second base resin layer 106b.

The fourth wiring layer 105d is formed on the backside surface of the third base resin layer 106c made of a polyimide, and the frontside surface of the third base resin layer 106c is adhesively fixed to the third wiring layer 105c with the adhesive layer 107c therebetween. A second coverlay layer 108b made of a polyimide is provided on the frontside surface of the fourth wiring layer 105d with the adhesive layer 107d therebetween, and is subjected to an electrical insulating treatment.

A double-sided tape 109 is attached to the second coverlay layer 108a, and the flexible substrate 102 is adhesively fixed to the magnetic body ring 103 with the double-sided tape 109 therebetween. As a result, the first wiring layer 105a, the second wiring layer 105b, the third wiring layer 105c, and the fourth wiring layer 105d are in turn being formed from the rotary shaft 101 side to the magnetic body ring 103 side.

The second wiring layer 105b and the third wiring layer 105c, which are the inner layers of the flexible substrate 102, are made of a rolled copper foil. The first wiring layer 105a and the fourth wiring layer 105d, which are the outer layers of the flexible substrate 102, are made of an electrolytic copper foil subjected to a copper plating. As will be described in detail later, in the magnetostrictive type sensor 100, since it is necessary to form a via (a through hole) in the flexible substrate 102, the first and the fourth wiring layers 105a and 105d, which are the outer layers, are configured in such a manner as to be subjected to a copper plating.

(Description of the Four Detecting Coils 11 (111, 112, 113 and 114))

FIG. 5 is a diagram showing one example of a respective wiring pattern formed in each wiring layer 105 (105a, 105b, 105c, and 105d) in the flexible substrate 102. FIG. 5 schematically shows the respective wiring patterns in the wiring layers 105 (105a, 105b, 105c, and 105d) with the flexible substrate 102 developed into a plane.

As shown in FIG. 5, the first, the second, the third and the fourth detecting coils 111, 112, 113 and 114 are formed in the wiring layers 105 of the flexible substrate 102. The first and the fourth detecting coils 111 and 114 are configured in such a manner as to include first straight line portions 111a and 114a the are inclined at a predetermined angle with respect to the axial direction of the rotary shaft 101, while the second and the third detecting coils 112 and 113 are configured in such a manner as to include second straight line portions 112a and 113a the are inclined at a predetermined angle with respect to the axial direction of the rotary shaft 101 but in the opposite direction to the first straight line portions 111a and 114a.

In the magnetostrictive type sensor 100, the change in the magnetic permeability with an applied torque acting on the rotary shaft 101 becomes the largest in the angles of ±45 degrees with respect to the axial direction of the rotary shaft 101. Thus, by forming the first straight line portions 111a and 114a in such a manner as to be inclined at +45 degrees with respect to the axial direction of the rotary shaft 101, and by forming the second straight line portions 112a and 113a in such a manner as to be inclined at −45 degrees with respect to the axial direction of the rotary shaft 101, it is possible to enhance the detection sensitivity of the magnetostrictive type sensor 100.

In this magnetostrictive type sensor 100, by partially swapping the wiring patterns in the wiring layers 105 for the first detecting coil 111 to be formed in, and the wiring layers 105 for the third detecting coil 113 to be formed in, the first and the third detecting coils 111 and 113 are configured in such a manner as to be formed over two of the wiring layers 105 (the first and the second wiring layers 105a and 105b). Similarly, by partially swapping the wiring patterns in the wiring layers 105 for the second detecting coil 112 to be formed in, and the wiring layers 105 for the fourth detecting coil 114 to be formed in, the second and the fourth detecting coils 112 and 114 are configured in such a manner as to be formed over two of the wiring layers 105 (the third and the fourth wiring layers 105c and 105d). The wiring layers 105 are electrically connected by vias therein.

By forming each detecting coil 11 over two of the wiring layers 105, it is possible to suppress the influences of the property differences between two of the wiring layers 105. As a result, it is possible to suppress the measurement errors caused by the property differences between the wiring layers 105 and thereby enhance the measurement accuracy of the magnetostrictive type sensor 100.

In the present embodiment, the wiring patterns to be formed in the first wiring layer 105a and the third wiring layer 105c, and the second wiring layer 105b and the fourth wiring layer 105d are configured as substantially the same patterns. Further, the alternating electric currents to be produced in the wiring patterns formed in the first wiring layer 105a and the third wiring layer 105c, and the second wiring layer 105b and the fourth wiring layer 105d are configured in such a manner as to be in the same flow directions. In FIG. 5, the flow directions of the alternating electric currents are indicated by outlined arrows. Further, in FIG. 5, the input side electrodes for the first, the second, the third and the fourth detecting coils 111, 112, 113 and 114 are denoted by reference characters 111b, 112b, 113b, and 114b, while the output side electrodes for the first, the second, the third and the fourth detecting coils 111, 112, 113 and 114 are denoted by reference characters 111c, 112c, 113c, and 114c. In addition, reference characters a to y and A to Y in FIG. 5 are those for conveniently showing the connection relationships with the vias, and indicate that the same reference characters are electrically connected together by the vias. Note that the respective wiring pattern of each wiring layer 105 shown in FIG. 5 is merely one example, and that the specific structure of the wiring patterns is not limited to the above structure of the wiring patterns.

In the magnetostrictive type sensor 100 using the flexible printed circuit board 102, the resistance component Rs of the four detecting coils 111, 112, 113 and 114 constituting the bridge circuit 14 is increased and, as a result, in the method of simply measuring the resistance component Rs of the four detecting coils 111, 112, 113 and 114 constituting the bridge circuit 14 and obtaining the temperature of those four detecting coils 111, 112, 113 and 114 from the measured resistance component Rs, a temperature range the cannot be detected may occur. As in the magnetostrictive type sensor temperature detecting circuit 1 according to the present embodiment, by detecting the amount of time, Ts, from when the voltage polarities of the alternating voltage Vb are switched until when the flow directions of the alternating electric current Ic flowing in the four detecting coils 111, 112, 113 and 114 constituting the bridge circuit 14 are switched, and computing the temperature of the four detecting coils 111, 112, 113 and 114 constituting the bridge circuit 14 on the basis of the amount of time, Ts, it is possible to accurately detect the temperature of the four detecting coils 111, 112, 113 and 114 constituting the bridge circuit 14 in a wide temperature range, and it is therefore possible to properly perform the temperature correction on the detected applied stress and make the high precision measurement of the applied stress.

Actions and Advantageous Effects of the Embodiment

As described above, the magnetostrictive type sensor temperature detecting circuit 1 according to the present embodiment includes the electric current switching time detecting section 2 configured to detect the amount of time, Ts, from when the voltage polarities of the output alternating voltage Vb are switched until when the flow directions of the alternating electric current Ic flowing in the four detecting coils 111, 112, 113 and 114 constituting the bridge circuit 14 are switched, and the temperature computing section 3 configured to compute the temperature of the four detecting coils 111, 112, 113 and 114 constituting the bridge circuit 14, on the basis of the amount of time, Ts, detected by the electric current switching time detecting section 2.

This makes it possible to accurately measure the temperature of the four detecting coils 111, 112, 113 and 114 constituting the bridge circuit 14 by utilizing the alternating voltage Vb from the driving section 12 designed for excitation with the alternating electric current, but without separately providing a temperature sensor such as a thermocouple or the like, or a direct electric current circuit designed for temperature detection or the like. The is, according to the present embodiment, it is possible to achieve the magnetostrictive type sensor temperature detecting circuit 1 the is configured to be able to detect the temperature of the four detecting coils 111, 112, 113 and 114 constituting the bridge circuit 14 at a low cost and with a simple configuration, and the is configured to be able to measure the temperature of the four detecting coils 111, 112, 113 and 114 constituting the bridge circuit 14 even when detecting the applied stress acting on the magnetostrictive member.

(Modifications)

In the above embodiment, the driving section 12 side end portion of the electric current detecting resistor 21 is connected to the non-inverting input terminal of the comparator 22, while the detecting coil 11 side (bridge circuit 14 side) end portion of the electric current detecting resistor 21 is connected to the inverting input terminal of the comparator 22, but the connections of the non-inverting input terminal and the inverting input terminal of the comparator 22 may be reversed. In this case, unlike the case of FIG. 3, the high level and the low level of the output voltage signal V1 of the comparator 22 are reversed, and therefore the high level and the low level of the output voltage signal V2 of the XOR circuit 23 are also reversed. As a result, the output voltage V0 from the low-pass filter 24 becomes a higher value as the amount of time, Ts, becomes shorter (the temperature of the four detecting coils 111, 112, 113 and 114 constituting the bridge circuit 14 becomes higher). Thus, even in this case, it is possible to detect the amount of time, Ts, in the time detecting section 25, from the output voltage V0 from the low-pass filter 24.

Also, an NXOR circuit (negative exclusive OR circuit) may be used in place of the XOR circuit 23 in the above embodiment. Also in this case, the output voltage V0 from the low-pass filter 24 becomes a higher value as the amount of time, Ts, becomes shorter (the temperature of the four detecting coils 111, 112, 113 and 114 constituting the bridge circuit 14 becomes higher), and therefore it is possible to detect the amount of time, Ts, in the time detecting section 25, from the output voltage V0 from the low-pass filter 24. Note that the XOR circuit 23 or the NXOR circuit may be configured as a combination of a plurality of logic circuits such as an AND circuit, an OR circuit and the like.

Figure 6A:
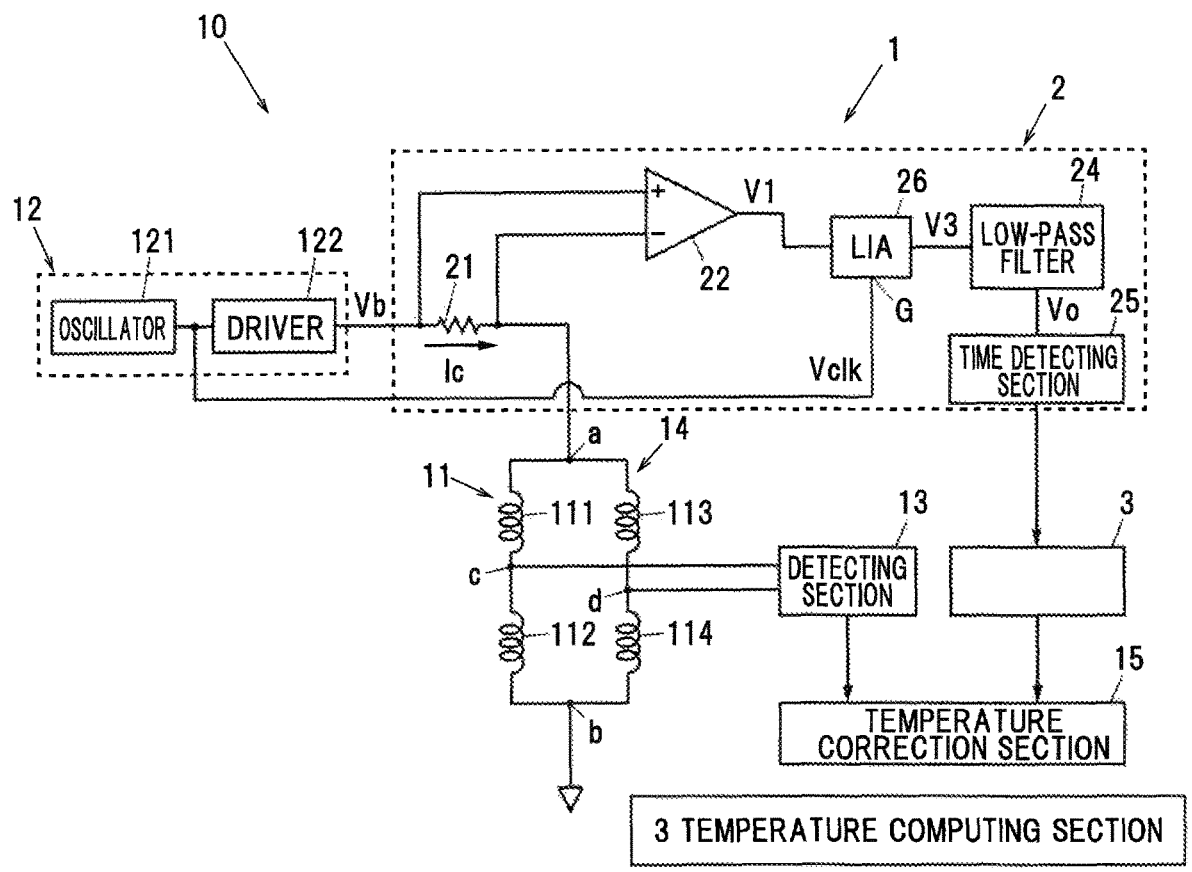
FIG. 6A is a block diagram showing a modification to the magnetostrictive type sensor temperature detecting circuit shown in FIG. 1.

Also, as shown in FIG. 6A, a lock-in amplifier (LIA) 26 can be used in place of the XOR circuit 23 in the above-described embodiment. In this case, the output of the comparator 22 may be connected to an input terminal of the lock-in amplifier 26, and the square wave signal Vclk from the oscillator 121 may be connected to a gate terminal G of the lock-in amplifier 26 as a gate signal. The lock-in amplifier 26 is made electrically conductive between its input terminal and its output terminal for a period of time for which the gate signal is high. Thus, the time charts for the square wave signal Vclk output from the oscillator 121 of the driving section 12, the output voltage signal V1 at the one output terminal of the comparator 22 of the electric current switching time detecting section 2, and the output voltage signal V3 at the one output terminal of the lock-in amplifier 26 are those shown in FIG. 6B.

Figure 6B:
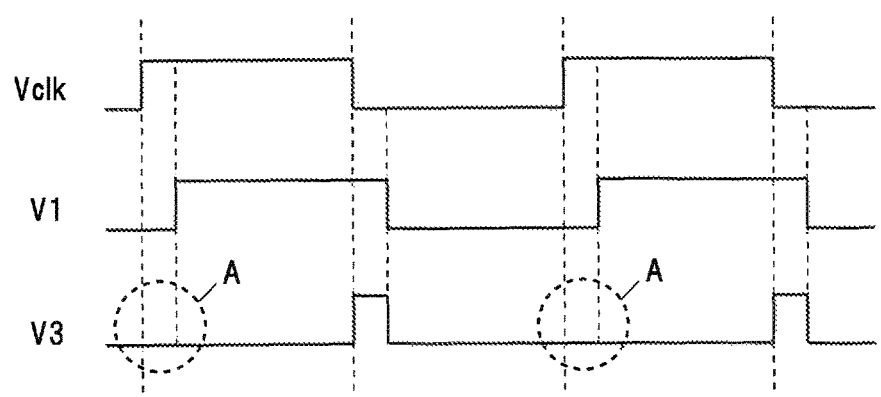
FIG. 6B is an explanatory time chart showing an operation of the magnetostrictive type sensor temperature detecting circuit shown in FIG. 6A.

As shown in the regions surrounded by the broken lines A in FIG. 6B, the output voltage signal V3 from the lock-in amplifier 26 does not become high when the square wave signal Vclk output from the oscillator 121 of the driving section 12 rises, and as a result, as compared with the output voltage signal V2 from the XOR circuit in FIG. 3, the duty ratio for the output voltage signal V3 from in the lock-in amplifier 26 becomes ½, but it is possible to detect the amount of time, Ts, using this output voltage signal V3. It should be noted, however, the, since the lock-in amplifier 26 is expensive, it can be said the it is more preferable to use the low-cost XOR circuit 23 as in the above embodiment.

Further, although not mentioned in the above embodiment, the comparator 22 may be configured by using an operational amplifier (a differential amplifier).

Figure 7:
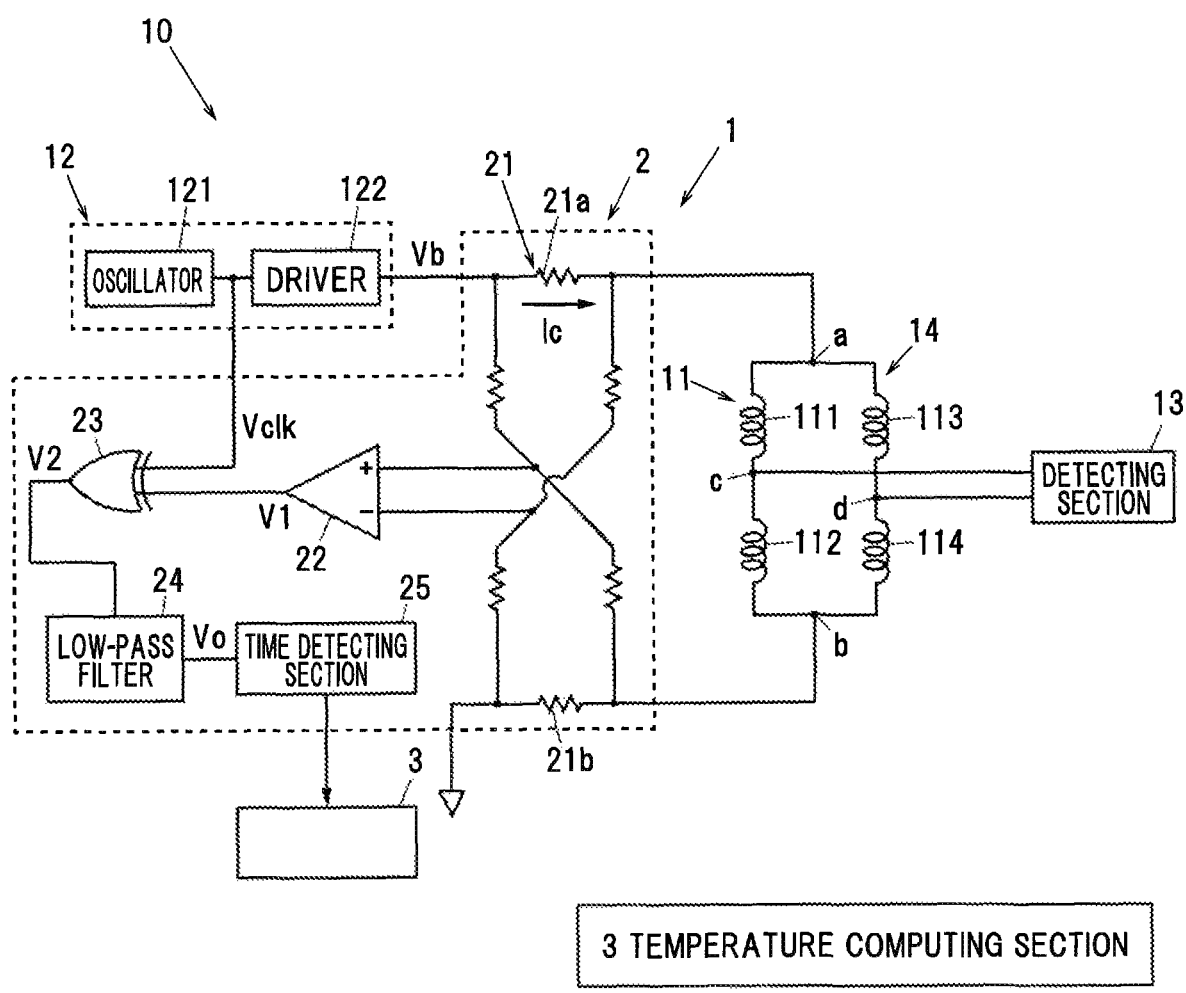
FIG. 7 is a block diagram showing a modification to the magnetostrictive type sensor temperature detecting circuit shown in FIG. 1.

Further, in the above embodiment, the case in which one electric current detecting resistor 21 is connected in series with the bridge circuit 14 has been described, but as shown in FIG. 7, two of the electric current detecting resistors, 21a and 21b, may be connected in such a manner that the bridge circuit 14 is located between those two electric current detecting resistors 21a and 21b. In this case, the driving section 12 side end portion of the electric current detecting resistor 21a and the detecting coil 11 side (bridge circuit 14 side) end portion of the electric current detecting resistor 21b may be connected to the non-inverting input terminal of the comparator 22 with an appropriate resistor R therebetween, while the detecting coil 11 side (bridge circuit 14 side) end portion of the detection resistor 21a and the ground side end portion of the electric current detecting resistor 21b may be connected to the inverting input terminal of the comparator 22 with an appropriate resistor R therebetween. This makes it possible to adjust the voltage values to be input to the comparator 22 into an appropriate range by appropriately adjusting the resistance values for the electric current detecting resistors 21a and 21b or the resistors R. In particular, when the comparator 22 is configured with an operational amplifier, the voltage values the can be input to the comparator 22 are limited, and it is therefore preferable to use the circuit configuration as shown in FIG. 7. Note the FIG. 7 is shown by omitting the temperature correction section 15.

Furthermore, although the low-pass filter 24 is used in the above embodiment, the low-pass filter 24 is not indispensable but can be omitted. For example, the electric current switching time detecting section 2 may be configured in such a manner that the output voltage signal V2 at the one output terminal of the XOR circuit 23 of the electric current switching time detecting section 2 is input directly to the time detecting section 25, and in the time detecting section 25, the period of time for which the output voltage signal V3 is kept high, the is, the amount of time, Ts, is detected.

Figure 8:
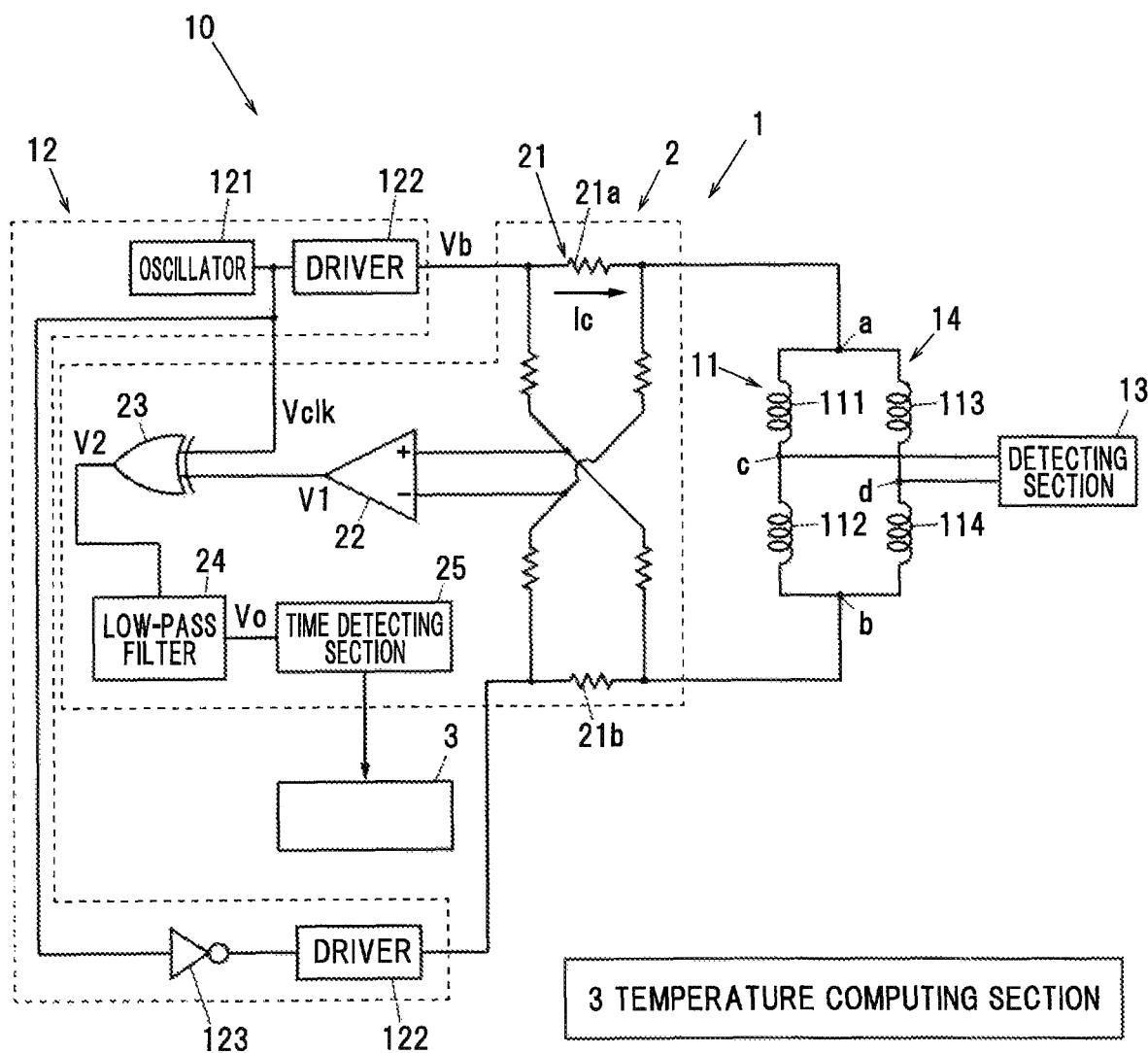
FIG. 8 is a block diagram showing a modification to the magnetostrictive type sensor temperature detecting circuit shown in FIG. 1.

Furthermore, although in the above-described embodiment, the driver 122 creates the rectangular wave alternating voltage signal Vb reversing positive and negative, but the present invention is not limited to the foregoing, but for example, a complementary voltage may be applied to the four detecting coils 111, 112, 113 and 114 constituting the bridge circuit 14, in such a manner as to input a square wave signal whose low level becomes 0 (V) to the contact point a side of the bridge circuit 14 while inputting a phase inverted square wave signal relative to the square wave signal input to the contact point a side of the bridge circuit 14 to the contact point b side of the bridge circuit 14. Specifically, for example, as shown in FIG. 8, the driving section 12 can be configured in such a manner as to include one pair of drivers 122, which are connected to the contact points a and b respectively, and input a signal from the oscillator 121 directly to one of the one pair of drivers 122 connected to the contact point a, while inputting the signal from the oscillator 121 to the other one of the one pair of drivers 122 connected to the contact point b, with a NOT circuit 123 therebetween. Since this eliminates the need to create a negative voltage in the drivers 122, it is possible to further simplify the circuit configuration of the drivers 122.

Figure 9A:
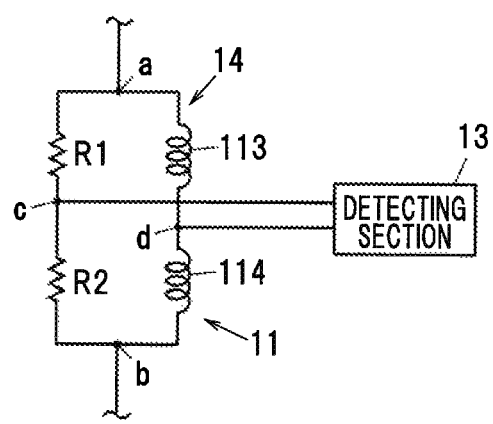
FIG. 9A is a diagram showing a modification to a bridge circuit for constituting the applied stress detecting circuit for constituting the magnetostrictive type sensor according to the present invention.
Figure 9B:
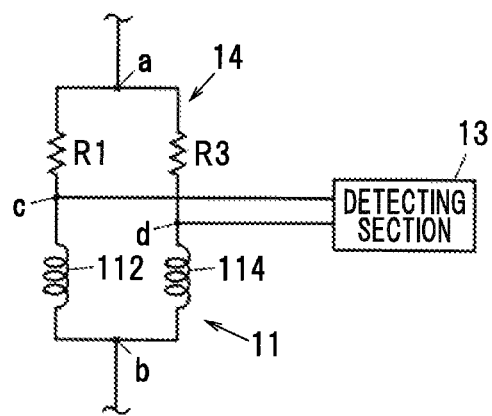
FIG. 9B is a diagram showing a modification to the bridge circuit for constituting the applied stress detecting circuit for constituting the magnetostrictive type sensor according to the present invention.

Also, in the above embodiment, the four detecting coils 11 are used, but the number of detecting coils 11 to be used is not limited to the above number. For example, as shown in FIG. 9A, the bridge circuit 14 may be configured in such a manner that the first and the second detecting coils 111 and 112 are replaced with resistors R1 and R2, and only the two detecting coils 11, i.e. the third and the fourth detecting coils 113 and 114 are used. Similarly, the bridge circuit 14 may be configured in such a manner that the third and the fourth detecting coils 113 and 114 are replaced with resistors, and only the first and the second detecting coils 111 and 112 may be used. Further, as shown in FIG. 9B, the bridge circuit 14 may be configured in such a manner that the first and the third detecting coils 111 and 113 are replaced with resistors R1 and R3, and only the two detecting coils 11 i.e. the second and the fourth detecting coils 112 and 114 are used. Similarly, the bridge circuit 14 may be configured in such a manner that the second and the fourth detecting coils 112 and 114 are replaced with resistors, and only the first and the third detecting coils 111 and 113 are used.

Furthermore, even when the four detecting coils 11 are used, only some of the detecting coils 11 may be provided around the periphery of the magnetostrictive member. For example, only the first and the second detecting coils 111 and 112 may be provided around the periphery of the magnetostrictive member, or only the third and the fourth detecting coils 113 and 114 may be provided around the periphery of the magnetostrictive member. Further, only the first and the third detecting coils 111 and 113 may be provided around the periphery of the magnetostrictive member, or only the second and the fourth detecting coils 112 and 114 may be provided around the periphery of the magnetostrictive member. The is, at least two of the first, the second, the third and the fourth detecting coils 111, 112, 113 and 114 may be provided around the periphery of the magnetostrictive member. Note that the detecting coils 11, which are not provided around the periphery of the magnetostrictive member, for example, may be provided separately from the magnetostrictive member, and may be provided around the periphery of a reference magnetostrictive member to which no external force (applied stress) is applied.

Further, although in the above-described embodiment, the case in which the four detecting coils 111, 112, 113 and 114 constituting the bridge circuit 14 are formed in the wiring layers 105 of the flexible substrate 102 has been described, the present invention is not limited to the foregoing, but the four detecting coils 111, 112, 113 and 114 may be formed by winding an electrical insulated wire around a ring shape bobbin or the like provided around the periphery of the magnetostrictive member, or the four detecting coils 111, 112, 113 and 114 may be formed by winding an electrical insulated wire directly around the periphery of the magnetostrictive member.

Further, in the above embodiment, the magnetostrictive type sensor 100 designed for torque detection has been described, but for example, the present invention may be applied to a magnetostrictive type sensor for load detection configured to detect an applied load in the axial direction of a shaft-shaped magnetostrictive member, and the like, as well.

Summary of the Embodiment

Next, the technical ideas grasped from the above-described embodiments will be described with the aid of the reference characters and the like in the embodiments. It should be noted, however, the each of the reference characters and the like in the following descriptions is not to be construed as limiting the constituent elements in the appended claims to the members and the like specifically shown in the embodiments.

[1] A magnetostrictive type sensor temperature detecting circuit (1), which is configured to be used in a magnetostrictive type sensor (100) including a detecting coil (11) provided around a periphery of a magnetostrictive member (101) and a driving section (12) configured to excite the detecting coil (11) with an alternating electric current, to detect an applied stress acting on the magnetostrictive member (101) on the basis of a change in an inductance of the detecting coil (11), to detect a temperature of the detecting coil (11), wherein the driving section (12) is configured to output an alternating voltage configured as a square wave voltage, and switch flow directions of the electric current flowing in the detecting coil (11) in response to switching voltage polarities of the output alternating voltage, wherein the temperature detecting circuit (1) comprises an electric current switching time detecting section (2) configured to detect an amount of time from when the voltage polarities of the output alternating voltage are switched until when the flow directions of the electric current flowing in the detecting coil (11) are switched, and a temperature computing section (3) configured to compute the temperature of the detecting coil (11) on the basis of the amount of time detected by the electric current switching time detecting section (2).

[2] The magnetostrictive type sensor temperature detecting circuit (1) as defined in the above [1], wherein the electric current switching time detecting section (2) includes an electric current detecting resistor (21), which is connected in series with the detecting coil (11), so that the electric current switching time detecting section (2) is able to detect the flow directions of the electric current flowing in the electric current detecting resistor (21).

[3] The magnetostrictive type sensor temperature detecting circuit (1) as defined in the above [2], wherein the electric current switching time detecting section (2) includes a comparator (22), with two input terminals of the comparator (22) being connected to both ends, respectively, of the electric current detecting resistor (21), so that the electric current switching time detecting section (2) is able to detect the flow directions of the electric current flowing in the electric current detecting resistor (21) on the basis of an output signal of the comparator (22).

[4] The magnetostrictive type sensor temperature detecting circuit (1) as defined in the above [3], wherein the driving section (12) includes an oscillator (121), which is configured to produce a square wave signal, and a driver (122), which is configured to create the alternating voltage from the square wave signal output from the oscillator (121) and output the alternating voltage, while the electric current switching time detecting section (2) includes an exclusive OR circuit (23), which are configured to be fed with the output signal of the comparator (22) and the square wave signal, and to output an exclusive OR output signal from the output signal of the comparator (22) and the square wave signal, so that the electric current switching time detecting section (2) detects the amount of time from when the voltage polarities of the output alternating voltage are switched until when the flow directions of the electric current flowing in the detecting coil (11) are switched, on the basis of the output of the exclusive OR circuit (23).

[5] The magnetostrictive type sensor temperature detecting circuit (1) as defined in the above [4], wherein the electric current switching time detecting section (2) includes a low-pass filter (24), which is configured to be fed with the exclusive OR output signal of the exclusive OR circuit (23), and a time detecting section (25), which is configured to detect the amount of time from when the voltage polarities of the output alternating voltage are switched until when the flow directions of the electric current flowing in the detecting coil (11) are switched, on the basis of an output voltage from the low-pass filter (24).

[6] A magnetostrictive type sensor (100), comprising: a detecting coil (11) provided around a periphery of a magnetostrictive member (101); a driving section (12) configured to excite the detecting coil (11) with an alternating electric current, to detect an applied stress acting on the magnetostrictive member (101) on the basis of a change in an inductance of the detecting coil (11); the magnetostrictive type sensor temperature detecting circuit (1) according to any one of [1] to [5]; and a temperature correction section (15) configured to make a temperature correction on the detected applied stress on the basis of the temperature of the detecting coil (11) having been detected by the magnetostrictive type sensor temperature detecting circuit (1).

[7] A magnetostrictive type sensor temperature detecting method, which is configured to be used in a magnetostrictive type sensor (100) including a detecting coil (11) provided around a periphery of a magnetostrictive member (101) and a driving section (12) configured to excite the detecting coil (11) with an alternating electric current, to detect an applied stress acting on the magnetostrictive member (101) on the basis of a change in an inductance of the detecting coil (11), to detect a temperature of the detecting coil (11), wherein the driving section (12) is configured to output an alternating voltage configured as a square wave voltage, and switch flow directions of the electric current flowing in the detecting coil (11) in response to switching voltage polarities of the output alternating voltage, to detect a temperature of the detecting coil (11), the temperature detecting method comprising: detecting an amount of time from when the voltage polarities of the output alternating voltage are switched until when the flow directions of the electric current flowing in the detecting coil (11) are switched; and computing the temperature of the detecting coil (11) on the basis of the detected amount of time.

Although the embodiments of the present invention have been described above, the above described embodiments are not to be construed as limiting the inventions according to the appended claims. Further, it should be noted the not all the combinations of the features described in the embodiments are indispensable to the means for solving the problem of the invention. Further, the present invention can be appropriately modified and implemented without departing from the spirit thereof.

Although the invention has been described with respect to the specific embodiments for complete and clear disclosure, the appended claims are not to be thus limited but are to be construed as embodying all modifications and alternative constructions the may occur to one skilled in the art which fairly fall within the basic teaching herein set forth.

What is claimed is:

1. A magnetostrictive type sensor temperature detecting circuit, which is configured to be used in a magnetostrictive type sensor including a detecting coil provided around a periphery of a magnetostrictive member and a driving section configured to excite the detecting coil with an alternating electric current, to detect an applied stress acting on the magnetostrictive member on the basis of a change in an inductance of the detecting coil, to detect a temperature of the detecting coil, wherein the driving section is configured to output an alternating voltage configured as a square wave voltage, and switch flow directions of the electric current flowing in the detecting coil in response to switching voltage polarities of the output alternating voltage, wherein the temperature detecting circuit comprises an electric current switching time detecting section configured to detect an amount of time from when the voltage polarities of the output alternating voltage are switched until when the flow directions of the electric current flowing in the detecting coil are switched, and a temperature computing section configured to compute the temperature of the detecting coil on the basis of the amount of time detected by the electric current switching time detecting section.

2. The magnetostrictive type sensor temperature detecting circuit according to claim 1, wherein the electric current switching time detecting section includes an electric current detecting resistor, which is connected in series with the detecting coil, so that the electric current switching time detecting section is able to detect the flow directions of the electric current flowing in the electric current detecting resistor.

3. The magnetostrictive type sensor temperature detecting circuit according to claim 2, wherein the electric current switching time detecting section includes a comparator, with two input terminals of the comparator being connected to both ends, respectively, of the electric current detecting resistor, so that the electric current switching time detecting section is able to detect the flow directions of the electric current flowing in the electric current detecting resistor on the basis of an output signal of the comparator.

4. The magnetostrictive type sensor temperature detecting circuit according to claim 3, wherein the driving section includes an oscillator, which is configured to produce a square wave signal, and a driver, which is configured to create the alternating voltage from the square wave signal output from the oscillator and output the alternating voltage, while the electric current switching time detecting section includes an exclusive OR circuit, which are configured to be fed with the output signal of the comparator and the square wave signal, and to output an exclusive OR output signal from the output signal of the comparator and the square wave signal, so that the electric current switching time detecting section detects the amount of time from when the voltage polarities of the output alternating voltage are switched until when the flow directions of the electric current flowing in the detecting coil are switched, on the basis of the output of the exclusive OR circuit.

5. The magnetostrictive type sensor temperature detecting circuit according to claim 4, wherein the electric current switching time detecting section includes a low-pass filter, which is configured to be fed with the exclusive OR output signal of the exclusive OR circuit, and a time detecting section, which is configured to detect the amount of time from when the voltage polarities of the output alternating voltage are switched until when the flow directions of the electric current flowing in the detecting coil are switched, on the basis of an output voltage from the low-pass filter.

6. A magnetostrictive type sensor, comprising:
a detecting coil provided around a periphery of a magnetostrictive member;
a driving section configured to excite the detecting coil with an alternating electric current, to detect an applied stress acting on the magnetostrictive member on the basis of a change in an inductance of the detecting coil;
the magnetostrictive type sensor temperature detecting circuit according to claim 1, and
a temperature correction section configured to make a temperature correction on the detected applied stress on the basis of the temperature of the detecting coil having been detected by the magnetostrictive type sensor temperature detecting circuit.

7. A magnetostrictive type sensor temperature detecting method, which is configured to be used in a magnetostrictive type sensor including a detecting coil provided around a periphery of a magnetostrictive member and a driving section configured to excite the detecting coil with an alternating electric current, to detect an applied stress acting on the magnetostrictive member on the basis of a change in an inductance of the detecting coil, to detect a temperature of the detecting coil, wherein the driving section is configured to output an alternating voltage configured as a square wave voltage, and switch flow directions of the electric current flowing in the detecting coil in response to switching voltage polarities of the output alternating voltage, to detect a temperature of the detecting coil, the temperature detecting method comprising:
detecting an amount of time from when the voltage polarities of the output alternating voltage are switched until when the flow directions of the electric current flowing in the detecting coil are switched; and
computing the temperature of the detecting coil on the basis of the detected amount of time.

* * * * *